United States Patent [19]

Cerda

[11] Patent Number: 5,220,285

[45] Date of Patent: Jun. 15, 1993

[54] SYSTEM FOR TESTING THE ELECTRICAL CONTINUITY AND INSULATION OF THE ELECTRICAL CONDUCTORS OF A PORTION OF WIRING

[75] Inventor: Léon G. Cerda, Carry-le-Rouet, France

[73] Assignee: Societe Anonyme die: Aerospatiale Societe Nationale Industrielle, Paris, France

[21] Appl. No.: 806,104

[22] Filed: Dec. 9, 1991

[30] Foreign Application Priority Data

Dec. 10, 1990 [FR] France .................. 90 15431

[51] Int. Cl.$^5$ .................................. G01R 31/02
[52] U.S. Cl. .................................. 324/540; 324/66; 324/158 F; 324/158 P
[58] Field of Search ............ 324/72.5, 158 P, 158 F, 324/66, 540, 541

[56] References Cited

U.S. PATENT DOCUMENTS

| | | | |
|---|---|---|---|
| 4,227,149 | 10/1980 | Faure | 324/158 P |
| 4,362,991 | 12/1982 | Carbine | 324/158 F |
| 4,471,298 | 9/1984 | Frohlich . | |
| 4,527,119 | 7/1985 | Rogers | 324/158 F |
| 4,626,780 | 12/1986 | Powers | 324/158 F |

FOREIGN PATENT DOCUMENTS

| | | |
|---|---|---|
| 0225682 | 6/1987 | European Pat. Off. . |
| 0383653 | 8/1990 | European Pat. Off. . |
| 1593025 | 5/1970 | France . |
| 2483159 | 11/1981 | France . |
| WO85/04488 | 10/1985 | PCT Int'l Appl. . |

Primary Examiner—Kenneth A. Wieder
Assistant Examiner—Jose M. Solis
Attorney, Agent, or Firm—Marshall, O'Toole, Gerstein, Murray & Bicknell

[57] ABSTRACT

A system for electrical continuity and insulation testing of the electrical conductors of a portion of wiring. Outputs (11b.1, 11b.2, 11b.3) of the connecting elements of the conductors are disposed on a support (12.1, 12.2, 12.3) in the form of a matrix and the means for selecting the output comprise a first set (13.1) and a second set (13.2) movable along rows and columns of the matrix to connect to the measuring means (5) those two outputs of the connecting elements which correspond to the first and second connecting elements of the conductor being tested and a third set (13.2) movable along the rows and columns of the matrix to connect to the measuring means (5) such an output of the connecting elements as corresponds to a connecting element of the conductor under test, and a fourth set (13.3) for connecting other outputs of the connecting elements to the measuring means (5).

8 Claims, 8 Drawing Sheets

SYSTEM FOR TESTING THE ELECTRICAL CONTINUITY AND INSULATION OF THE ELECTRICAL CONDUCTORS OF A PORTION OF WIRING

BACKGROUND OF THE INVENTION

This invention relates to a system for testing the electrical continuity and insulation of the electrical conductors of a portion of wiring. The term "portion of wiring" denotes a bunch of conductors—i.e., of electrical wires or cables—for transmitting the data and instructions necessary for the operation of a complex machine, inter alia an aircraft.

To check the electrical continuity and insulation of the conductors of a portion or length of wiring after its production at works and before it is fitted, for example, in an aircraft such as a helicopter, it is known to use a special test bench to which all the conductors of the wiring are connected.

It is known that such a system for testing the electrical continuity and insulation of the electrical conductors of a portion of wiring, each conductor having first and second connecting elements, comprises:

- link means for linking with the first and second connecting elements of each conductor, the link means comprising a number of connecting elements to whose inputs the first and second connecting elements of each conductor can be connected;
- means for measuring an electrical parameter and connected to predetermined outputs of the connecting elements of the link means by way of means for selecting such outputs in order to connect the first and second connecting elements of the conductor under test to the measuring means so as to test the electrical continuity of such conductor, and in order to connect the conductor under test to at least some other conductors of the wiring in order to test the insulation of such conductor relatively to the other conductors;
- means for generating an electrical parameter identical to or different from the measured parameter, and
- means for piloting the system and analysing the tests.

In conventional test benches the means for selecting the outputs of the link connecting elements take the form of sets of selectors or switches and controls therefor. Consequently, for a test bench which may comprise several thousand test points, switches to the same number must be provided and even when ways and means for regrouping the switches are used the number of controls for the switches is still very high. Also, the need to be able to withstand voltage and the need for maintenance are two of several factors making it necessary to use specific switches known as reed switches. The same are embodied by two magnetic strips separated by an air gap and enclosed in a glass vessel in an inert atmosphere or in vacuo. To withstand the voltage the mass of magnetic material and the air gap between the reeds must be relatively large, and so a switch of this kind takes up appreciable space. The volume and weight of a conventional test bench are therefore considerable. For example, the size of a 8400-point test bench now currently used is approximately 4 m³ and it weighs from 600 to 700 kg, obviously with severe detriment to its mobility and flexibility of use. Also, the large number of controls (174 controls for an 8400 point test bench) means that the piloting means become very complex with a corresponding risk of breakdowns and poor reliability.

OBJECT OF THE INVENTION

It is the object of this invention to obviate these disadvantages and the invention relates to a system for testing the electrical continuity and the insulation of the conductors of a portion of wiring, the bulk, weight and power consumption of the system being very low as compared with conventional systems and reliability being greater than that of conventional systems.

SUMMARY OF THE INVENTION

To this end, the system for testing the electrical continuity and insulation of the electrical conductors of a portion of wiring of the kind hereinbefore set out is distinguished according to the invention in that the outputs of the link connecting elements are disposed on a support in the form of an n-row p-column matrix, and the selecting means comprise for the continuity test first and second sets movable along the matrix rows and columns in order to connect to the measuring means the two outputs of the link connecting elements which correspond to the first and second connecting elements of the conductor under test and for the insulation test a third set movable along the matrix rows and columns in order to connect to the measuring means such an output of the link connecting elements as corresponds to a connection element of the conductor under test, and a fourth set to connect at least some other outputs of the link connecting elements to the measuring means.

The system according to this invention therefore takes advantage of the great accuracy now obtainable in the movements of mechanical elements (in the event, the sets) and advances in microengineering to simplify the electrical functions used in the conventional systems. More particularly, the system according to the invention is so contrived as to reduce the conventional burden of a large number of switches and controls by a considerable reduction in the bulk and weight by the system and of its power consumption and with an increase in its reliability.

Advantageously, the first, second, third and fourth sets are each associated with an n-row p-column matrix of the outputs of the link connecting elements, the corresponding matrix outputs being connected in parallel, and the first, second and third sets each comprise a mechanism having crossing movements along the first and second axes respectively parallel to the matrix rows and columns, the mechanism being connected to a contact element of the outputs, the contact element being adapted to move parallel to a third axis perpendicular to the plane defined by the first and second axes.

More particularly, the mechanism can have two parallel uprights on which a cross-bar is slidable, a support for the contact element being movable along the cross-bar.

Preferably, the fourth set comprises an electrically conductive plate in contact with the respective outputs of the link connecting elements and disposed on a support movable parallel to the matrix columns, the top end of the support having a row of elements contacting the outputs, each element being movable perpendicularly to the plane of the support.

More particularly, each of the contact elements is a ram associated with a cylinder in which a piston separating therein a pressurised compartment from an unpressurised compartment can move parallel to the matrix rows.

Advantageously, the second and third sets form a single set associated with a single matrix which can be used either for the continuity test or for the insulation test.

Preferably, all the supports and sets is maintained in a vacuum or in an inert atmosphere.

More particularly, the measuring means can comprise an ohmmetric measuring bridge coupled with a stabilised high-voltage generator.

INTRODUCTION OF THE DRAWINGS

The accompanying drawings will make clearly apparent how the invention may be carried into effect. Like references denote like elements throughout the drawings.

In the drawings.

DESCRIPTION OF PREFERRED EMBODIMENTS

Figure 1:
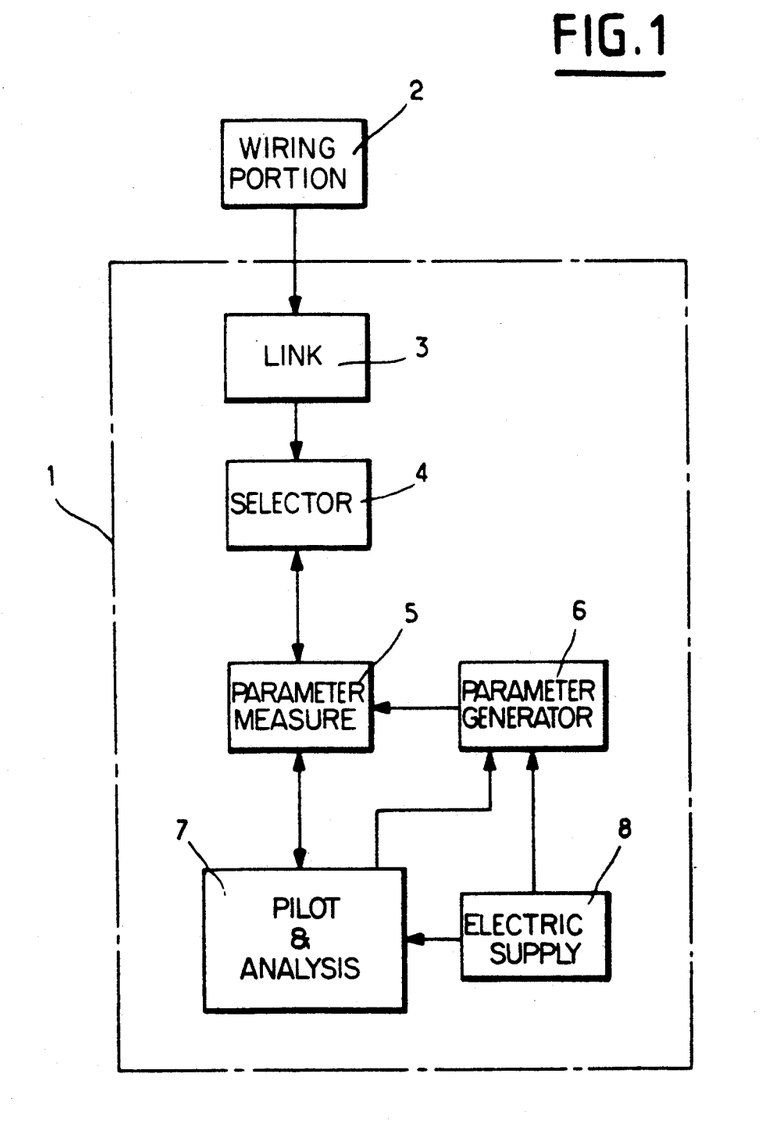
FIG. 1 is a block schematic diagram of a system for testing the electrical continuity and insulation of the conductors of a portion or length of wiring.

Referring to FIG. 1, a system 1 for testing the electrical continuity and insulation of the electrical conductors of a portion of wiring 2 usually comprises:
  means 3 for linking with each of the conductors of the wiring 2;
  means 4 for selecting predetermined outputs of the link means 3;
  means 5 for measuring an electrical parameter adapted to be applied to the predetermined outputs of the link means 3;
  means 6 for generating an electrical parameter identical to or different from the measured parameter, the means 6 being connected to the measuring means 5;
  means 7 for piloting the system 1 and analysing the tests, and
  a main electricity supply 8.

Figure 2:
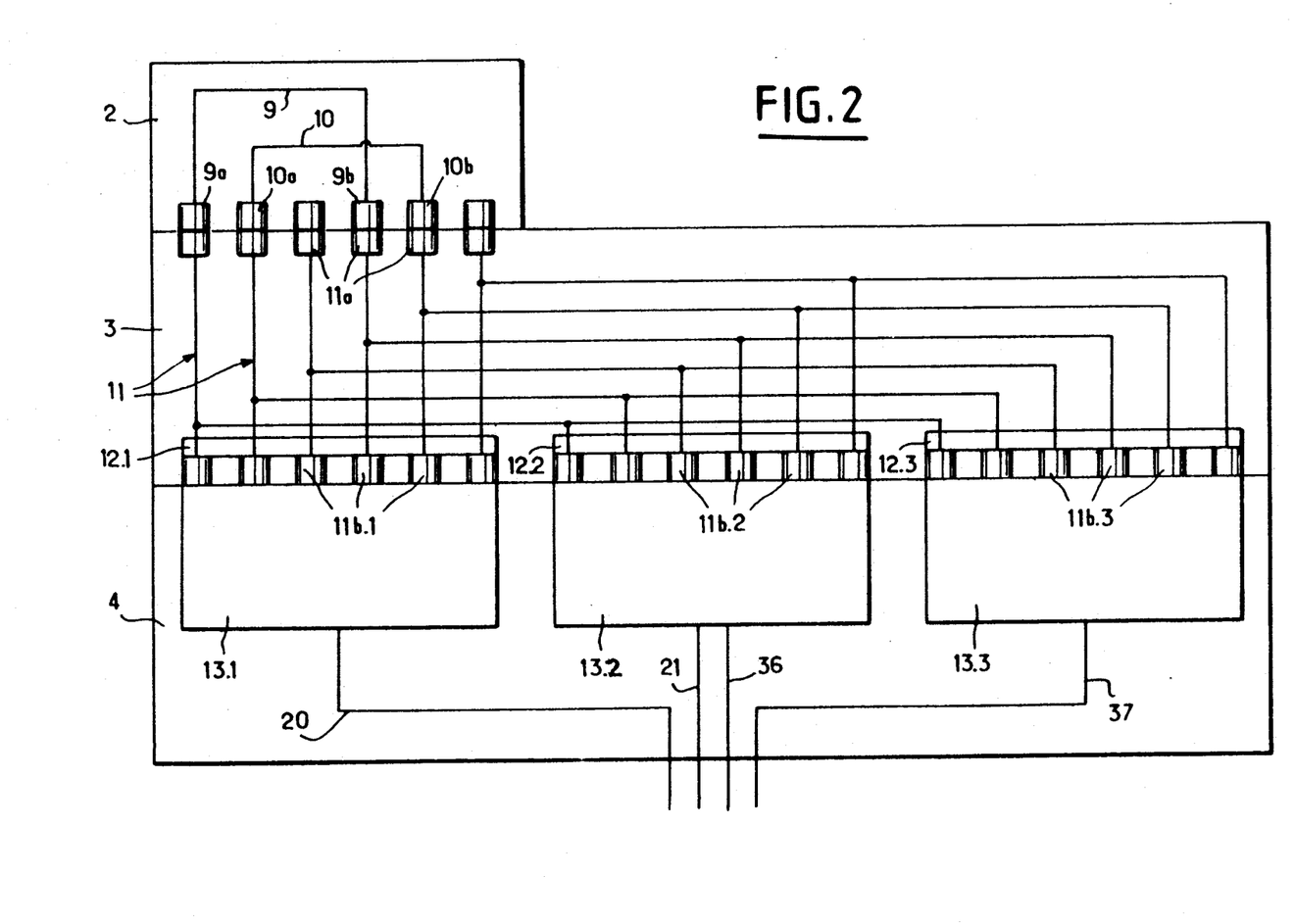
FIG. 2 is a diagrammatic view of an embodiment of the link means and selection means according to the invention.

FIG. 2 is a diagrammatic plan view of an example of the architecture of the link means 3 and selection means 4 of the system 1 according to the invention and shows two conductors 9, 10 of the wiring 2 (which of course actually contains a large number of conductors), each conductor 9, 10 having first connecting elements 9a, 10a and second connecting elements 9b, 10b.

The link means 3 comprise a number of connecting elements 11 (here again the number of connecting elements shown is purely by way of illustration) to whose inputs 11a the first connecting elements 9a, 10a and second connecting elements 9b, 10b of each of the conductors 9, 10 can be connected and whose parallel-connected outputs 11b.1, 11b.2, 11b.3 are disposed on respective supports 12.1, 12.2, 12.3 and connected to the selection means 4 which will be described in detail hereinafter.

Figure 3:
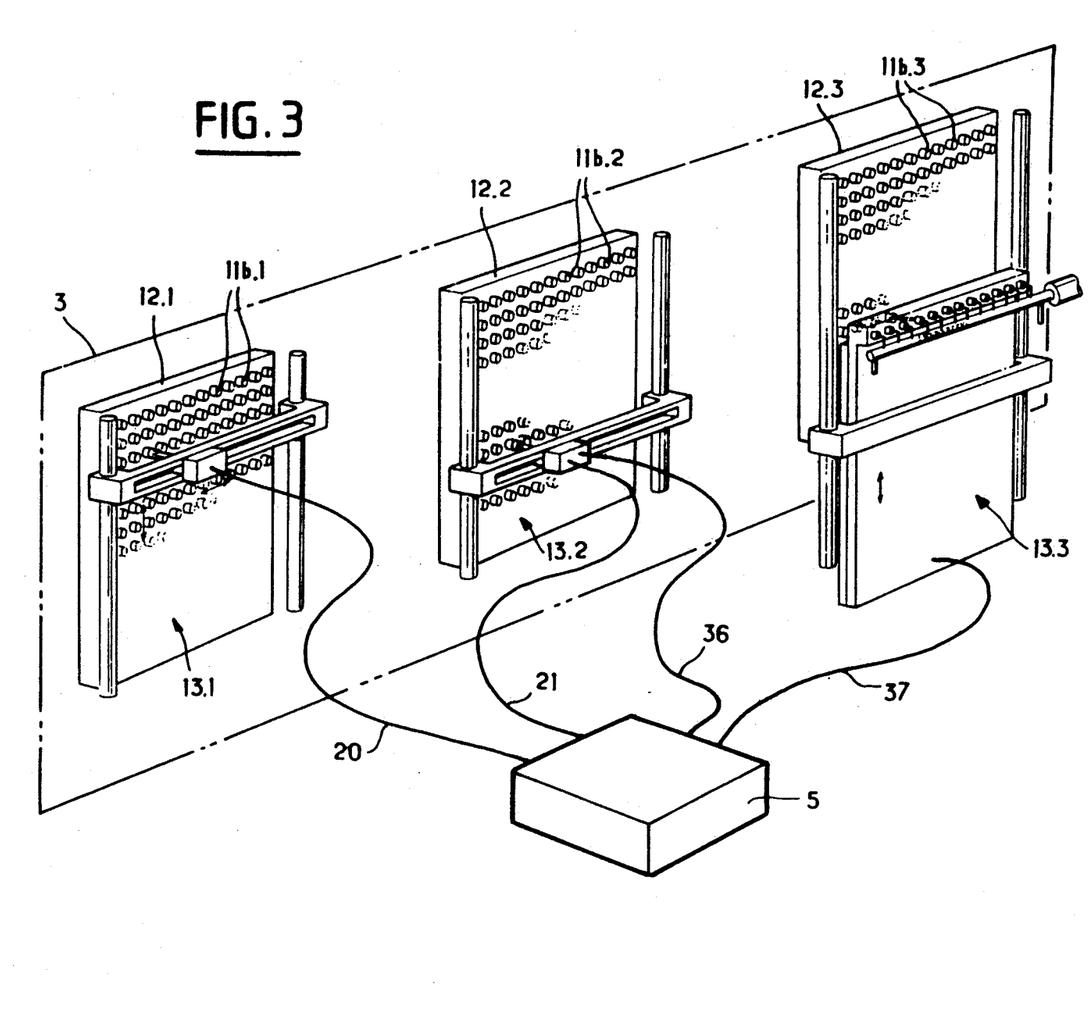
FIG. 3 is a diagrammatic perspective view showing more particularly the sets serving as the selection means of the system according to the invention.

FIG. 3 shows more clearly the actual arrangement inter alia of the link means 3 and selection means 4. In this practical embodiment of the invention the outputs 11b.1, 11b.2, 11b.3 of the connecting elements 11 are combined on their respective supports 12.1, 12.2, 12.3 in the form of three n-row p-column matrices and the selection means 4 comprise three sets 13.1, 13.2, 13.3 each associated with a matrix of the outputs 11b.1, 11b.2, 11b.3. Advantageously, all the supports and sets are maintained in vacuo or in an inert atmosphere to ensure the reliability of the measurements.

More particularly, the sets 13.1, 13.2 which are used for continuity testing and whose structures are identical are movable along the rows and columns of the corresponding matrix of outputs 11b.1, 11b.2.

Figure 4:
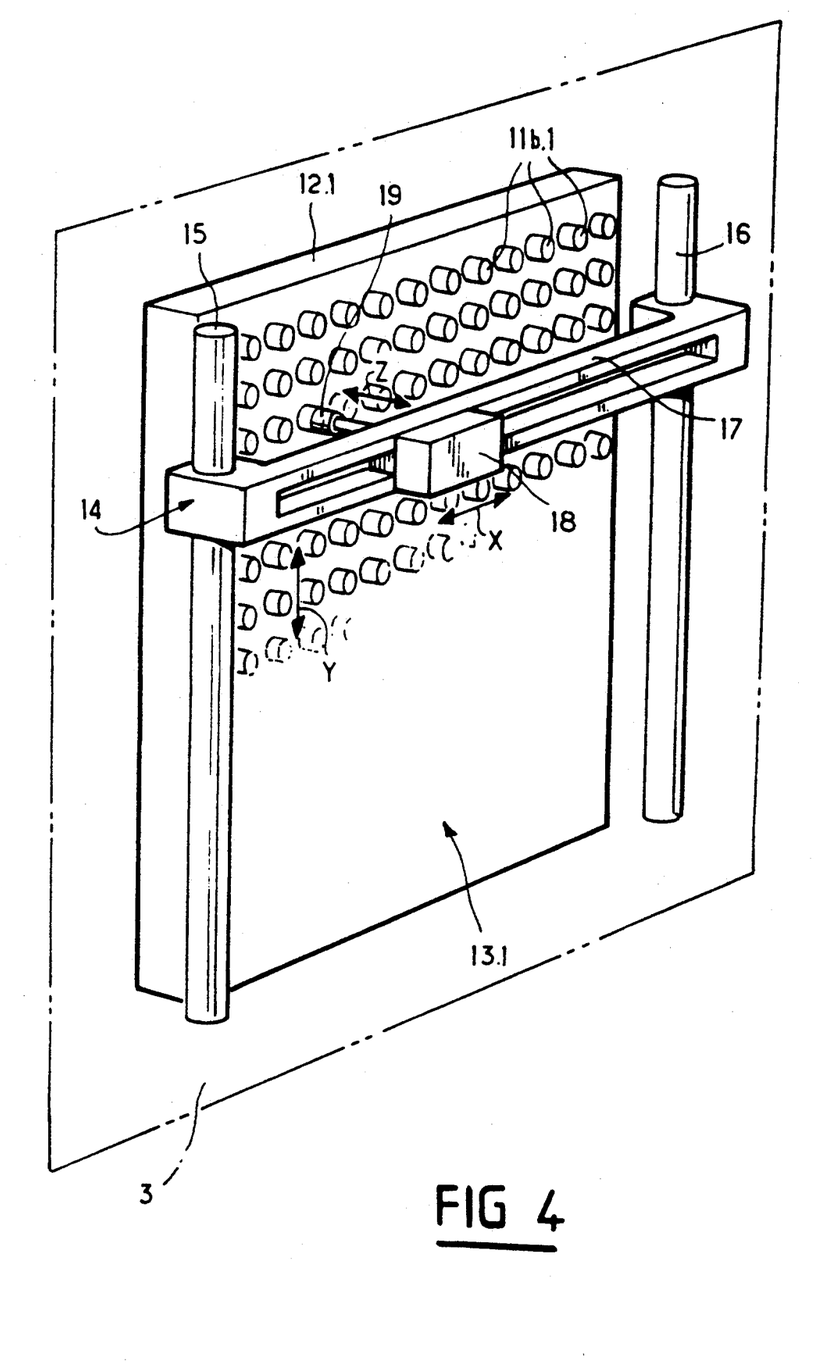
FIG. 4 is a diagrammatic perspective view to an enlarged scale of a first kind of set of FIG. 3.

As will be more clearly apparent from FIG. 4 where the set 13.1 is shown to an enlarged scale (the set 13.2 is of identical structure), the set 13.1 comprises a mechanism 14 having crossing movements and movable along axes X and Y respectively parallel to the rows and columns of the associated matrix of outputs 11b.1. The mechanism 14, driven by motor means which are not shown, comprises two uprights 15, 16 which are parallel to the Y axis (and disposed one at each end of the support 12.1) and on which a cross-bar 17 can slide parallel to the axis X, a support 18 for an element 19 which contacts one of the matrix outputs 11b.1 being slidable along the cross-bar 17. The element 19, which can be embodied as a pneumatically or electrically or electromechanically operated ram, can move parallel to an axis Z perpendicular to the plane defined by the axes X and Y.

Also, and as shown in FIG. 3, the sets 13.1, 13.2 are connected to the measuring means 5 by respective links 20, 21.

The set 13.2 is also of use for insulation testing in association with the set 13.3 which is of a different structure and which will be described hereinafter with reference to FIGS. 5-7.

Figure 5:
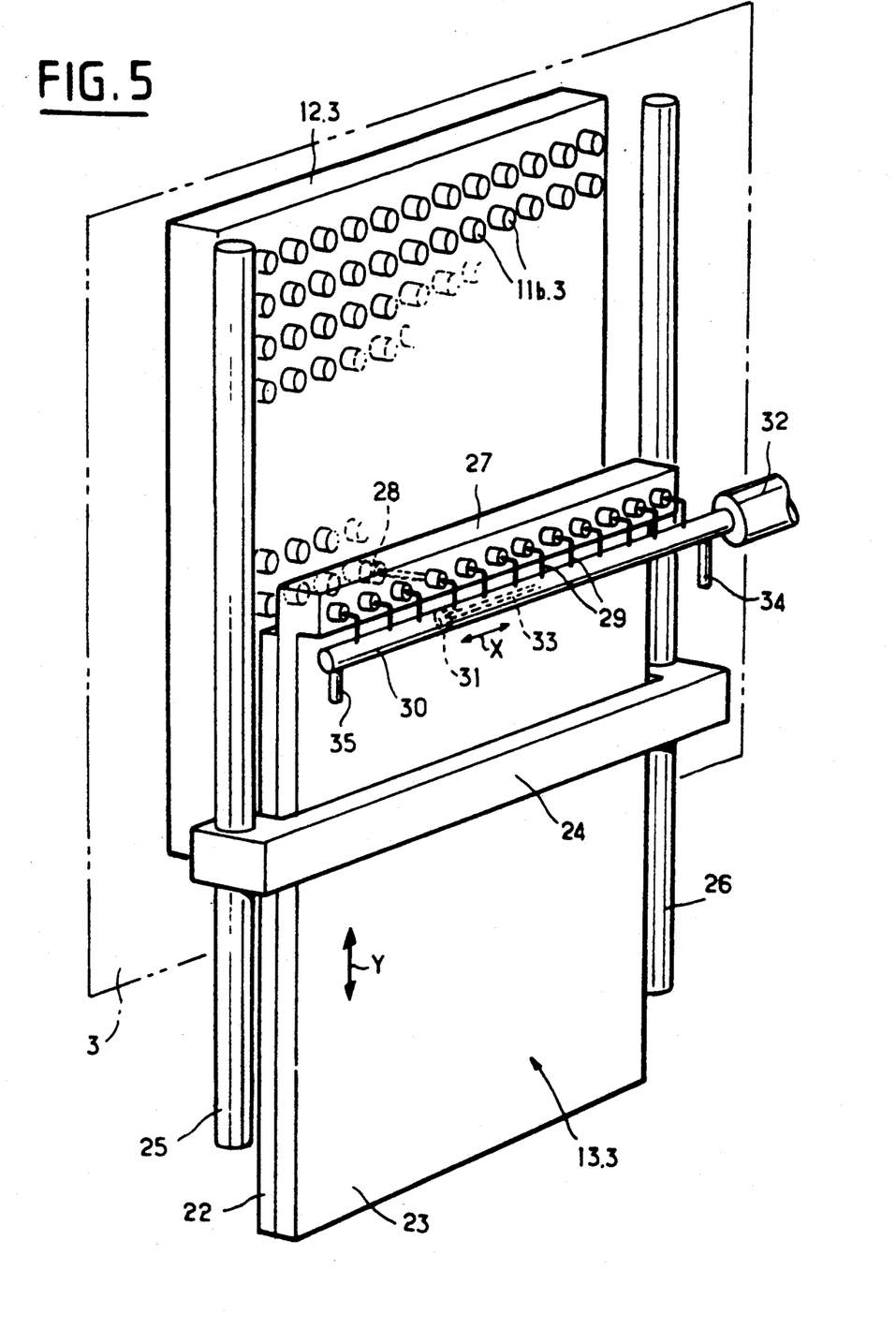
FIG. 5 is a diagrammatic perspective view to an enlarged scale of a second kind of set of FIG. 3.

Referring to FIG. 5, the set 13.3 comprises an electrically conductive plate 22 in contact with the connecting element outputs 11b.3, the plate 22 being disposed on a support 23 movable parallel to the axis Y—i.e., to the columns of the corresponding matrix. To this end, the support 23 and plate 22 are rigidly secured to a cross-bar 24 which is parallel to the axis X and which is guided on uprights 25, 26 parallel to the axis Y, the whole being moved by motor or drive means which are not shown.

Figure 6:
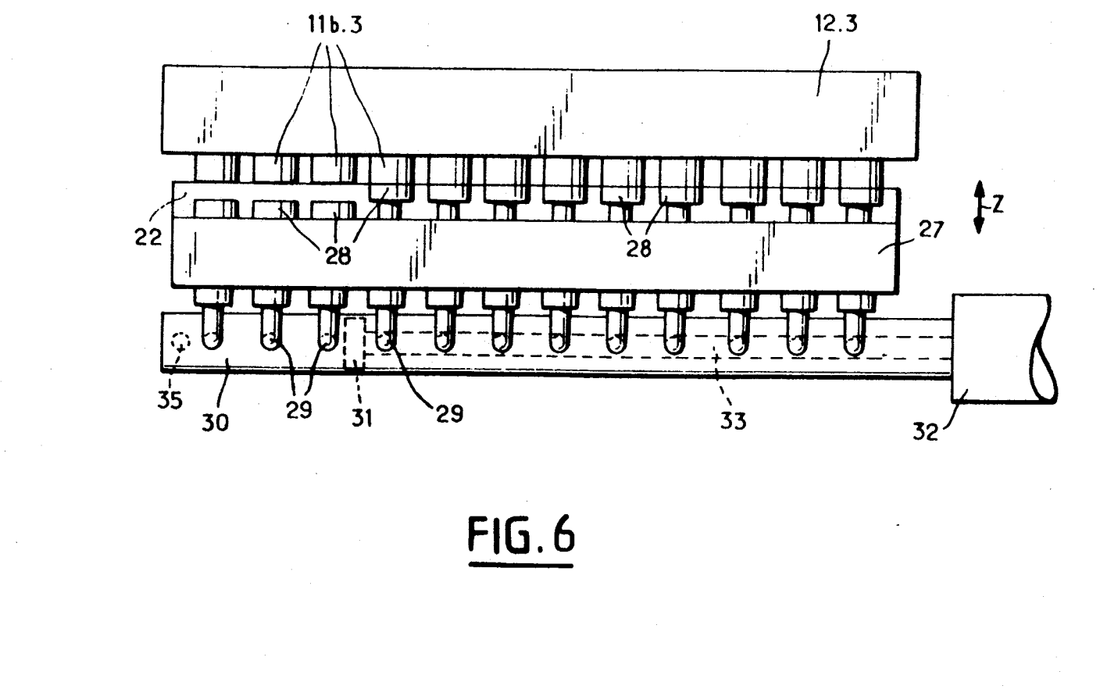
FIG. 6 is a plan view of the set shown in FIG. 5.
Figure 7:
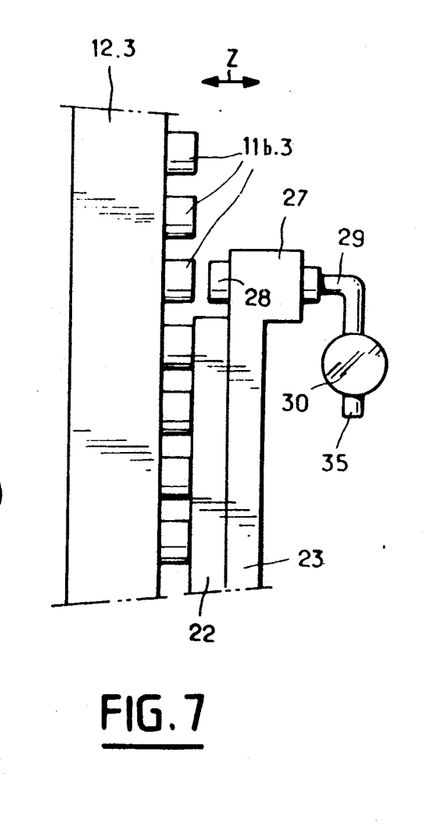
FIG. 7 is a partial side view of the set shown in FIG. 5.

Also, and as will be more clearly apparent from FIGS. 6 and 7, top end 27 of support 23 has a row of elements 28 contacting the outputs 11b.3 and extending parallel to the axis X—i.e., parallel to a matrix row. Each contact element 28 is preferably a pneumatic ram adapted to move parallel to the axis Z as hereinbefore defined in association by way of a duct 29 with a cylinder 30 in which a piston 31 can be moved parallel to the axis X by means of a motor 32 to which the piston 31 is connected by a piston rod 33. The cylinder 30 is also connected to a pressurising duct 34 connected to a fluid supply (not shown) and to a duct 35 venting to atmosphere.

Also, and as FIG. 3 shows, the sets 13.2, 13.3 are connected to the measuring means 5 by respective connections 36, 37.

The system according to the invention therefore actually uses three selection (or switching) modules, viz.:
two modules 13.1, 13.2 for continuity testing (starting point, arrival point), and
two modules 13.2, 13.3 for insulation testing (test point and short circuit of lower addresses).

As previously stated, the module 13.2 is common to both kinds of testing.

As measuring means 5 there can be used an ohmetric measuring bridge which has a measurement range of a few milliohms to 500 megohms and which is coupled with a stabilised high-voltage generator with stepwise adjustment of its range.

Figure 8:
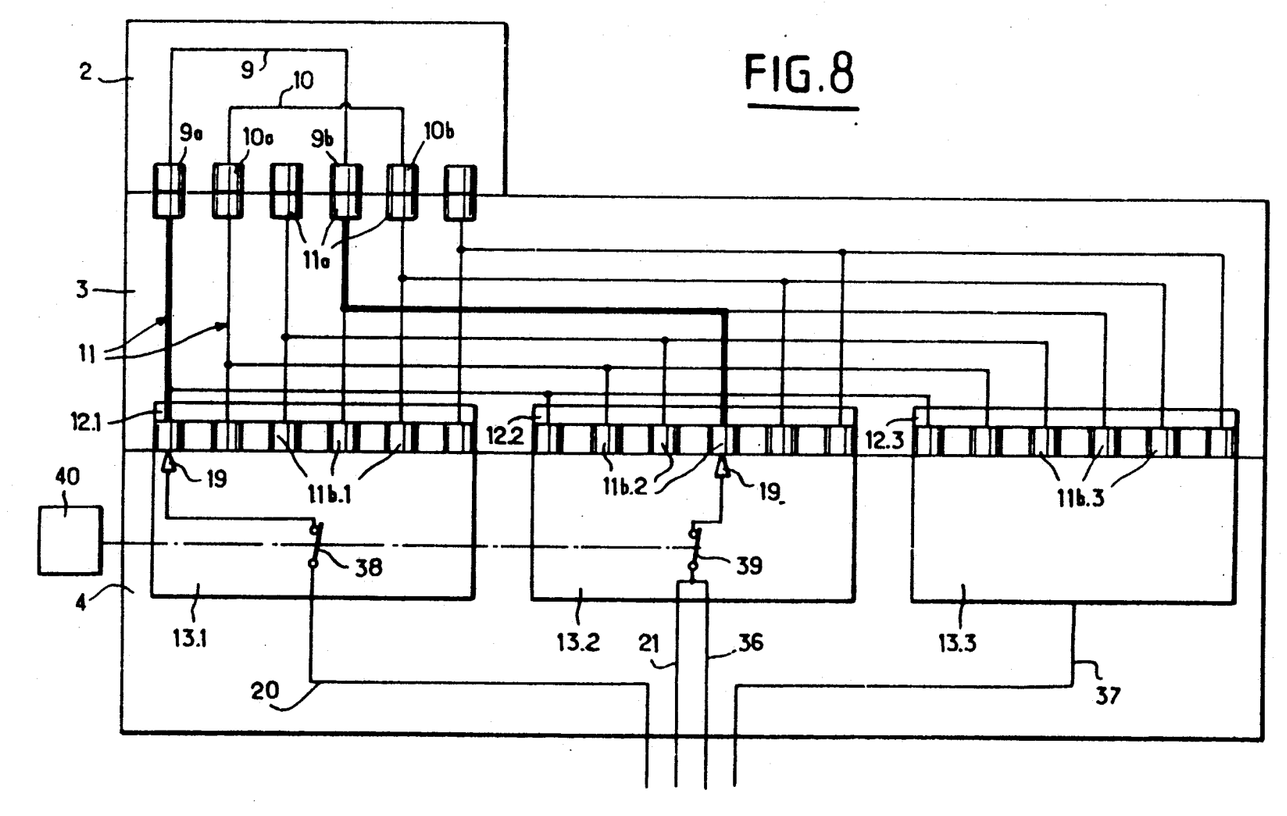
FIGS. 8 and 9 respectively show the principle of continuity testing and the principle of insulation testing an electrical conductor of the portion of wiring.

FIG. 8 in association with FIG. 3 shows the principle of continuity testing an electrical conductor of the wiring.

For continuity testing, for example, the conductor 9 the first and second connecting elements 9a, 9b of the conductor 9 should be connected by way of a respective connecting element 11 to the measuring means 5 and therefore to the means 6 generating an electrical parameter such as current or voltage. To this end, the piloting means 7 move the contact element 19 of the set 13.1 into contact, by movement of the mechanism 14 along the X and Y axes and movement of the contact element 19 along the Z axis, with that output 11b.1 on the support 12.1 which corresponds to the input 11a of the connecting element 11 connected to the first connecting element 9a of the conductor 9. Similarly, the contact element 19 of the set 13.2 is brought into contact in the same way with that output 11b.2 on the support 12.2 which corresponds to the input 11a of the connecting element 11 connected to the second connecting element 9b of the conductor 9.

The circuit is closed by switches 38, 39 being closed by means of a control 40 so that the conductor can be continuity tested through the agency of the measuring means 5, the module 13.3 being inoperative in this case.

A conductor is insulation tested in relation to the other conductors of the wiring. However, for the sake of economy and speed of operation the following method is used as in the case of most existing test benches. For a set of, for example, ten independent conductors a test is made on the first conductor by connecting the other nine conductors to the measuring means. If the test is positive—i.e., if the insulation of the first conductor passes the test—it is considered unnecessary to check whether the second conductor is insulated from the first conductor. The second conductor is therefore tested relatively to the remaining eight conductors, the third relatively to the remaining seven conductors and so on for all the conductors of the wiring.

Figure 9:
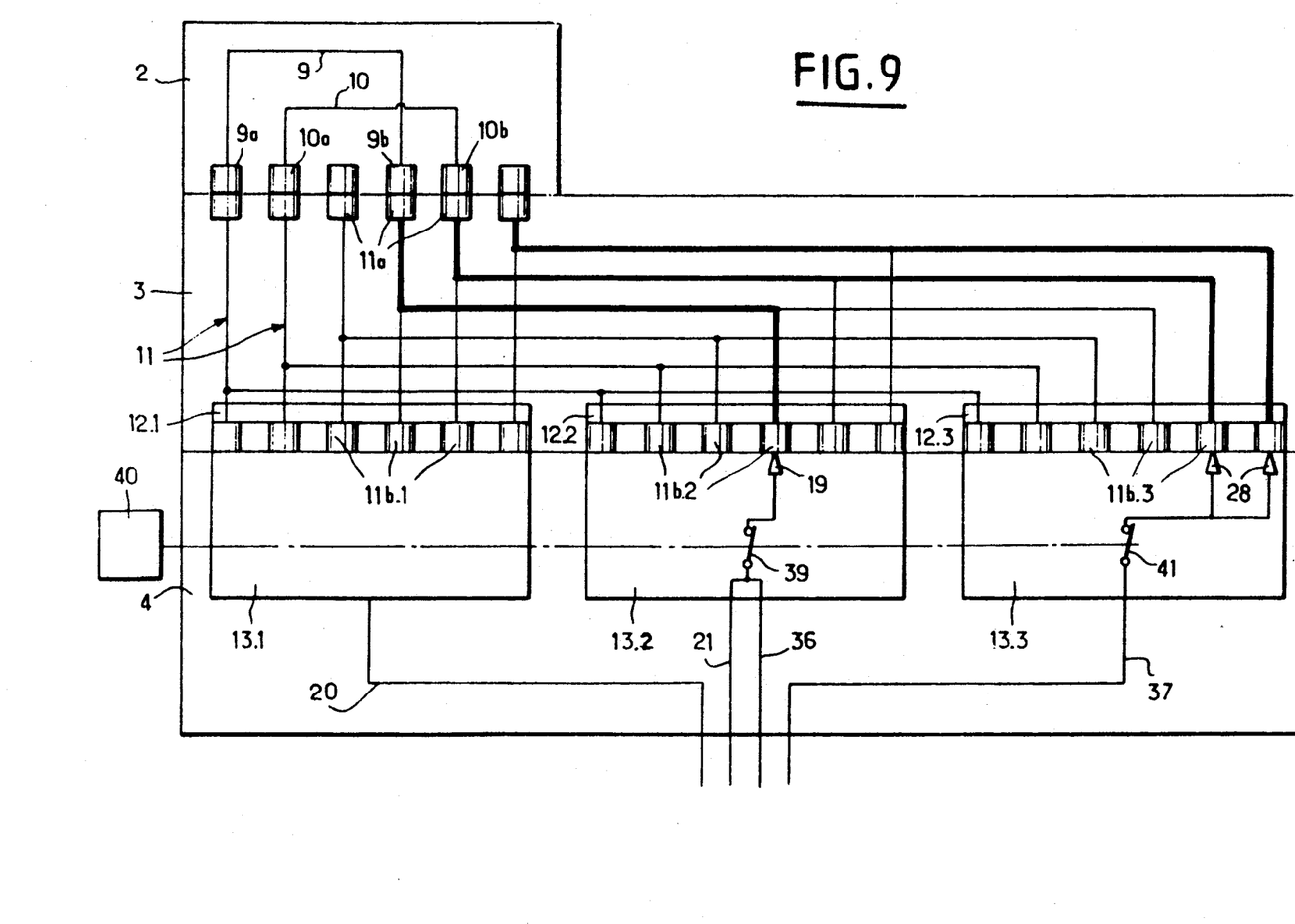

FIG. 9 in association with FIG. 3 illustrates the principle on which insulation testing of a conductor of the wiring is based.

To test the insulation, for example, of the conductor 9 by the method hereinbefore set out, the second connecting element 9b of the conductor 9 should be connected to the measuring means 5. To this end, the piloting means 7 move the contact element 19 of the set 13.2 into contact with that output 11b.2 on the support 12.2 which corresponds to such input 11a of the connecting element 11 as is connected to the second connecting element 9b of the conductor 9. Also, all the outputs 11b.3 of addresses below the testing point must be short circuited. This is shown in FIG. 9 and more realistically in FIG. 3. As the latter shows, the plate 22 of the set 13.3 short-circuits all the matrix outputs which are below the row containing the testing point. Also, all the outputs of this row to the right of the testing point are in contact with the corresponding elements 28. This is achieved by the position of the piston 31 being adjusted by means of the motor 32 and of the rams 28 being pressurised by fluid supplied through the duct 34.

The circuit is closed by switches 39, 41 being operated by means of the control 40 so that the measuring means 5 can insulation test the conductor (the module 13.1 is ineffective in this case).

Also, all the supplementary functional possibilities to aid the operator and of dynamic testing can as in conventional systems be incorporated in the system according to the invention, viz.:
complete self-testing;
compiling (learning on a piece of wiring deemed satisfactory);
plain language in response to defect;
programmable continuity and insulation testing ranges;
in response to a continuity defect, search for the reversal;
researching all the points and listing in response to an insulation defect;
measurement of resistance, electrical capacitance and d.c. and a.c. voltage and current;
diode measurement;
dialogue with operator;
programmable feeding permitting dynamic testing.

The following comparative table shows for a test bench having 8400 testing points the advantages as regards bulk and number of controls of the system according to the invention as compared with a conventional system (the controls of the system according to the invention comprise simply stepping motors for the sets, three contacting drives (axis Z) and a relay (three stages) for switching current (voltage)).

|  | Conventional system | System according to the invention |
| --- | --- | --- |
| Number of controls | 174 | 11 |
| Volume (m$^3$) | 4 | 0.5 |
| Weight (kg) | 600–700 | Below 100 |

The system according to the invention therefore has a mobility and flexibility of use greater than that of conventional systems and the simplification of the drives, facilitates maintenance of the system and makes it more reliable, while the power it needs for its operation is appreciably less than the power needed to operate the numerous switches of a conventional system.

What is claimed is:

1. A system for testing the electrical continuity and insulation of electrical conductors in a portion of wiring, each conductor having first and second connecting elements, said system comprising:
   link means for linking with the first and second connecting elements of each conductor, said link means comprising a number of connecting elements having inputs connectable to said first and second connecting elements of said portion of wiring under test;

measuring means for indicating an electrical parameter, said measuring means being connected to predetermined outputs of said link means, with said link means arranged to connect said measuring means for both continuity and insulating readings;

means for generating an electrical parameter which is a function of said measured electrical parameter, and means for controlling the system and analyzing the test, characterized in that the outputs (11b.1, 11b.2, 11b.3) of said link means connecting elements are disposed on a support (12.1, 12.2, 12.3) in the form of an n-row p-column matrix, said link means further comprising selecting means for continuity tests with first (13.1) and second (13.2) sets movable along the matrix row and columns in order to connect to the measuring means (5) the outputs of the link means connecting elements which correspond to the first and second connecting elements of the conductor under test, said link means further comprising selecting means for the insulation tests having a third set (13.2) movable along the matrix rows and columns in order to connect to the measuring means (5) outputs of the link means connecting elements which correspond to connection elements of the conductor under test, said link means further comprising a fourth set (13.3) to connect to other said predetermined outputs of said link means connecting elements to the measuring means (5).

2. A system according to claim 1, characterised in that the first, second, third and fourth sets are each associated with an n-row p-column matrix of the outputs of the link means connecting elements, the corresponding matrix outputs being connected in parallel, and the first, second and third sets each comprise a mechanism (14) having crossing movements along the first and second axes respectively parallel to the matrix rows and columns, the mechanism (14) being connected to a contact element (19) of the outputs, the contact element (19) being adapted to move parallel to a third axis perpendicular to the plane defined by the first and second axes.

3. A system according to claim 2, characterised in that the mechanism (14) has two parallel uprights (15, 16) on which a cross-bar (17) is slidable, a support (18) for the contact element (19) being movable along the cross-bar (17).

4. A system according to claim 2, characterised in that the fourth set (13.3) comprises an electrically conductive plate (22) in contact with the respective outputs of the link connecting elements and disposed on a support (23) movable parallel to the matrix columns, the top end (27) of the support having a row of elements (28) contacting the outputs, each element (28) being movable perpendicularly to the plane of the support (23).

5. A system according to claim 4, characterised in that each of the contacting elements is a ram (28) associated with a cylinder (30) in which a piston (31) separating therein a pressurised compartment from an unpressurised compartment can move parallel to the matrix rows.

6. A system according to claim 1, characterised in that the second and third sets form a single set (13.2) associated with a single matrix which can be used either for the continuity test or for the insulation test.

7. A system according to claim 1, characterised in that all the supports (12.1, 12.2, 12.3) and sets (13.1, 13.2, 13.3) are maintained in a vacuum or in an inert atmosphere.

8. A system according to claim 1, characterised in that the measuring means (5) comprise an ohmmetric measuring bridge coupled with a stabilised high-voltage generator.

* * * * *